United States Patent
Chan et al.

(10) Patent No.: US 9,659,655 B1
(45) Date of Patent: May 23, 2017

(54) MEMORY ARRAYS USING COMMON FLOATING GATE SERIES DEVICES

(71) Applicant: INTERNATIONAL BUSINESS MACHINES CORPORATION, Armonk, NY (US)

(72) Inventors: Kevin K. Chan, Staten Island, NY (US); Bahman Hekmatshoartabari, White Plains, NY (US); Tak H. Ning, Yorktown Heights, NY (US); Jeng-Bang Yau, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/259,763

(22) Filed: Sep. 8, 2016

(51) Int. Cl.
*G11C 16/04* (2006.01)
*H01L 27/1156* (2017.01)
*H01L 29/423* (2006.01)
*H01L 29/788* (2006.01)
*G11C 16/10* (2006.01)

(52) U.S. Cl.
CPC ........ *G11C 16/0441* (2013.01); *G11C 16/045* (2013.01); *G11C 16/10* (2013.01); *H01L 27/1156* (2013.01); *H01L 29/42324* (2013.01); *H01L 29/7885* (2013.01)

(58) Field of Classification Search
CPC .......................... G11C 16/0441; G11C 16/045
See application file for complete search history.

(56) References Cited

U.S. PATENT DOCUMENTS

| 4,785,199 | A | * | 11/1988 | Kolodny | H03K 19/1736 257/316 |
| 5,594,687 | A | * | 1/1997 | Lin | G11C 16/0441 257/E27.103 |
| 5,604,700 | A | * | 2/1997 | Parris | H01L 27/115 257/E27.103 |
| 5,615,150 | A | * | 3/1997 | Lin | G11C 16/0441 257/E27.103 |

(Continued)

FOREIGN PATENT DOCUMENTS

| CN | 105448730 | 3/2016 |
| JP | 2008511971 | 4/2008 |
| KR | 101055930 | 8/2011 |

OTHER PUBLICATIONS

John Robertson, Band offsets of wide-band-gap oxides and implications for future electronic devices, Journal of Vacuum Science & Technology (Feb. 2000).

(Continued)

*Primary Examiner* — Vanthu Nguyen
(74) *Attorney, Agent, or Firm* — Tutunjian & Bitetto, P.C.; Louis J. Percello

(57) ABSTRACT

Semiconductor devices and methods of writing information to a memory cell include an n-type transistor connected to a first terminal. The n-type transistor is formed with a low injection-barrier material gate dielectric. A p-type transistor is connected in serial between the n-type transistor and a second terminal. The p-type transistor is formed with a low injection-barrier material gate dielectric. The first and second transistor share a common floating gate and a common output node.

11 Claims, 4 Drawing Sheets

(56) References Cited

U.S. PATENT DOCUMENTS

| | | | | |
|---|---|---|---|---|
| 5,646,901 | A | * 7/1997 | Sharpe-Geisler | G11C 16/0441 257/E27.103 |
| 5,847,993 | A | * 12/1998 | Dejenfelt | G11C 16/0441 257/E27.103 |
| 5,892,709 | A | * 4/1999 | Parris | G11C 16/0441 257/371 |
| 7,550,337 | B2 | 6/2009 | Chang et al. | |
| 7,700,993 | B2 | 4/2010 | Cai et al. | |
| 7,833,849 | B2 | 11/2010 | Callegari et al. | |
| 8,705,280 | B2 | 4/2014 | Cai et al. | |
| 9,269,786 | B2 | 2/2016 | Chou et al. | |
| 2006/0226489 | A1 | * 10/2006 | Wang | G11C 16/045 257/365 |
| 2008/0203485 | A1 | 8/2008 | Chudzik et al. | |
| 2010/0159684 | A1 | 6/2010 | Chang et al. | |
| 2014/0048888 | A1 | 2/2014 | Chen et al. | |

OTHER PUBLICATIONS

Byung-Hyuk Min et al., A Novel Offset Gated Polysilicon Thin Film Transistor Without an Additional Offset Mask, IEEE Electron Device Letters, vol. 16, No. 5, May 1995.
James R. Pfiester et al., A Novel PMOS SOI Polysilicon Transistor, IEEE Electron Device Letters, vol. 11, No. 8, Aug. 1990.

\* cited by examiner

MEMORY ARRAYS USING COMMON FLOATING GATE SERIES DEVICES

BACKGROUND

Technical Field

The present invention generally relates to series transistor devices arranged in serial and, more particularly, to designs for such devices that may be used in memory arrays.

Description of the Related Art

Hot carrier injection is a phenomenon in semiconductor devices where a charge carrier (e.g., an electron or a hole) overcomes a potential barrier and, potentially, changes the behavior of a semiconductor device (such as, e.g., a complementary metal oxide semiconductor (CMOS) device). This phenomenon provides one mechanism for the design of an electrically erasable programmable read only memory (EEPROM), where the behavior of the device is stable over time but can be changed by the application of hot carrier injection.

However, existing designs for CMOS EEPROM devices suffer from inefficiencies in the application of hot hole injection. In particular, the use of silicon dioxide as a gate dielectric in CMOS devices results in a high energy barrier for the injection of hot holes (e.g., about 5 eV), such that the possible designs for CMOS EEPROM designs are limited.

SUMMARY

Semiconductor devices include an n-type transistor connected to a first terminal. The n-type transistor is formed with a low injection-barrier material gate dielectric. A p-type transistor is connected in serial between the n-type transistor and a second terminal. The p-type transistor is formed with a low injection-barrier material gate dielectric. The first and second transistor share a common floating gate and a common output node.

A memory array includes an N×M array of memory cells. Each memory cell includes an n-type transistor connected to a first terminal. The n-type transistor is formed with a low injection-barrier material gate dielectric. A p-type transistor is connected in serial between the n-type transistor and a second terminal. The p-type transistor includes a low injection-barrier material gate dielectric. The first and second transistor share a common floating gate and a common output node.

A method of storing information on a memory cell includes triggering hot carrier injection in a memory cell comprising an n-type transistor and a p-type transistor. The n-type transistor and the p-type transistor each sharing a common floating gate and a common output node. Each of the n-type transistor and the p-type transistor includes a low injection-barrier material gate dielectric.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention implement common floating gate complementary metal oxide semiconductor (CMOS) electrically erasable programmable read only memory (EEPROM) devices using gate dielectric materials that reduce the energy barrier for hot hole injection in an n-type FET (nFET) and the energy barrier for hot electron injection in a p-type FET (pFET). In one specific set of embodiments, a pair of field effect transistors (FETs), one nFET and one pFET are arranged in serial between a high voltage terminal and a low voltage terminal with a common gate. By lowering the energy barrier for hot hole injection in the nFET, the present embodiments make it possible to have the efficiency of hot hole injection in the nFET to be comparable to the efficiency of hot electron injection in the pFET. Such EEPROMs can be formed in an array to create addressable memory.

Figure 1:
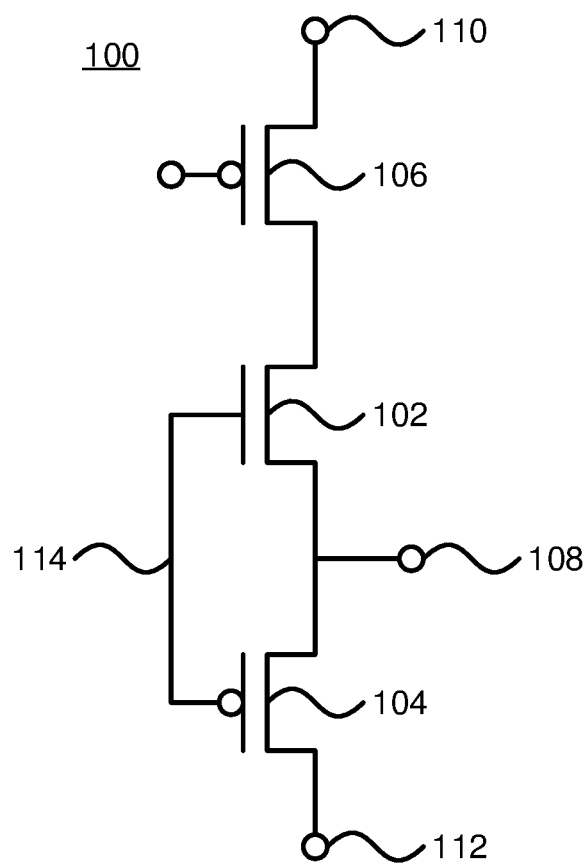
FIG. 1 is a circuit schematic of a memory cell in accordance with the present principles.

Referring now top FIG. 1, a circuit schematic is shown for a single EEPROM cell 100. The EEPROM device 100 is formed from a first transistor 102 and a second transistor 104 with a shared gate terminal 114. The transistors are arranged in serial with a high voltage terminal 110 and a low voltage terminal 112 with an access transistor 106 controlling voltage to the first transistor 102. In one exemplary embodiment, the high voltage terminal 110 carries a system voltage $V_{DD}$ and the low voltage terminal 112 is at ground. It is specifically contemplated that the first transistor 102 is an nFET and that the second transistor 104 is a pFET. In one embodiment the access transistor 106 may be a pFET, though it should be understood that the particular configuration of the access transistor can be adapted by those having ordinary skill in the art to the particular application. The first and second transistor 102 and 104 have a common output terminal 108.

The access transistor 106 controls writing to and reading from the EEPROM memory cell 100. The state of the device is held by the state of the common floating gate 114. Hot carrier injection are used to move charges from the high voltage terminal 110 or the low voltage terminal 112 to the gate of the respective first transistor 102 or second transistor 104. These charges will remain on the floating gates until neutralized by charges of the opposite polarity (e.g., negatively charged electrons will remain until they meet a positively charged hole and holes will remain until they meet an electron).

In a CMOS device, electrons are free to move about in the semiconductor conduction band and holes are free to move about in the semiconductor valence band. The conduction band of the gate dielectric is at a higher electron energy level than the semiconductor conduction band. This energy difference represents a barrier energy for an electron getting from the semiconductor into the gate dielectric. For an electron to jump from the semiconductor into the gate dielectric, it has to acquire a kinetic energy comparable to or greater than this barrier energy. An electron having a kinetic energy larger than its thermal energy, which is determined by the semiconductor temperature, is referred to as a "hot" electron. Similarly the valence band of the gate dielectric is at a higher hole energy level than the semiconductor valence band. This energy difference represents a barrier energy for a hole getting from the semiconductor into the gate dielectric. For a hole to jump from the semiconductor into the gate dielectric, it has to acquire a kinetic energy comparable to or greater than this hole barrier energy. A hole having a kinetic energy larger than its thermal energy is referred to as a "hot" hole. For an FET that uses silicon dioxide for a gate dielectric layer, hot electrons generally need a kinetic energy of about 3.1 eV, which is barrier energy for electrons to be injected efficiently from the FET semiconductor into the FET gate dielectric. Hot electrons having smaller kinetic energy of, e.g., about 2.8 eV, may still be injected from the FET semiconductor into the FET gate dielectric by a tunneling process which is very inefficient. For a hot hole in such an FET, a higher kinetic energy of about 4.8 eV, which is the barrier energy for holes, is needed for it to be injected efficiently from the FET semiconductor into the FET gate dielectric. Hot holes having smaller kinetic energy of, e.g., about 3.1 eV, may only tunnel from the FET semiconductor into the FET gate dielectric, but at a negligibly slow rate.

The charge on the shared floating gate 114 determines which of the two transistors is active. The accumulated charges on the shared floating gate 114 will determine the voltage on the devices relative to their source terminals and will turn those devices off or on, such that one of the high voltage and the low voltage will be exposed on the output terminal 108 when the access transistor 106 is activated.

Figure 2:
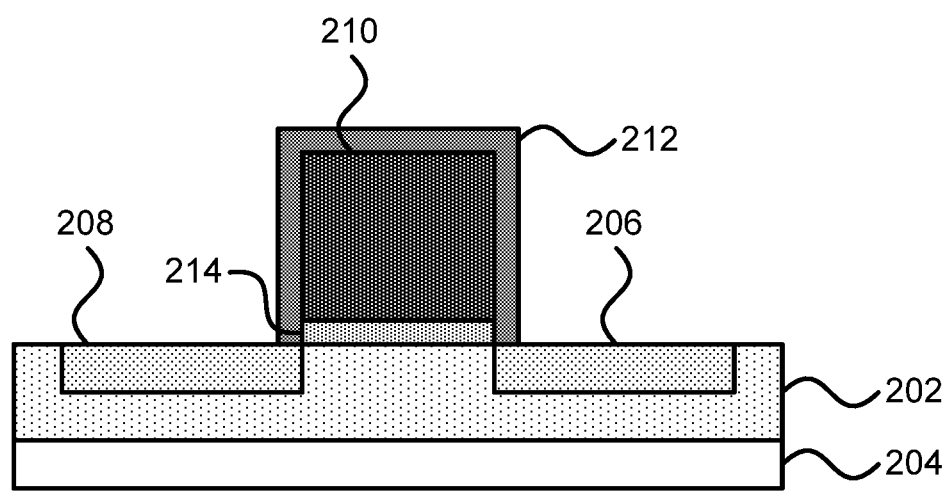
FIG. 2 is a cross-sectional diagram of a field effect transistor in accordance with the present principles.

Referring now to FIG. 2, a diagram of an FET is shown. A semiconductor substrate 202 is formed, in one embodiment, on a buried dielectric layer 204. The buried dielectric may be formed from silicon dioxide or any other appropriate dielectric material. The semiconductor substrate may be formed from a silicon-containing material such as, e.g., silicon, silicon germanium, silicon germanium carbide, silicon carbide, polysilicon, epitaxial silicon, amorphous silicon, and multilayers thereof. Although silicon is the predominately used semiconductor material in wafer fabrication, alternative semiconductor materials can be employed such as, but not limited to, germanium, gallium arsenide, gallium nitride, cadmium telluride, and zinc selenide. In an alternative embodiment the semiconductor substrate 202 may be a bulk substrate without the buried dielectric layer 204.

Source and drain regions 206/208 are formed in or on the semiconductor layer 202. The source and drain regions 206/208 may be formed by implantation of an appropriate p-type or n-type dopant. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor In a silicon containing substrate examples of n-type dopants, i.e., impurities, include but are not limited to antimony, arsenic and phosphorous. A region of the semiconductor substrate 202 between the source and drain regions 206/208 is the channel region, and it is through the channel region that current flows when the device is activated.

A gate 210 is formed with a gate dielectric 214 and a spacer 212 that insulate the gate from the source/drain regions 206/208 and the channel region. The gate dielectric 214 affects the properties of the device, in particular with respect to hot carrier injection. Efficient hot-electron injection can be achieved in pFETs using gate dielectrics such as, e.g., silicon nitride ($Si_3N_4$), yttrium oxide ($Y_2O_3$), zirconium oxide ($ZrO_2$), or hafnium oxide ($HfO_2$). Efficient hot hole injection can be achieved in nFETs using gate dielectrics such as, e.g., silicon nitride ($Si_3N_4$), yttrium oxide ($Y_2O_3$), zirconium oxide ($ZrO_2$), or hafnium oxide ($HfO_2$). Each of these materials provide energy barriers significantly lower than that imposed by silicon dioxide. These materials are referred to herein as low injection-barrier materials.

The use of low injection-barrier materials for the gate dielectric of nFETs makes it possible to implement the EEPROM device 100, in particular with the nFET taking the position of the first transistor 102, connected to the high voltage terminal 110 via the access transistor 106. This structure allows efficient injection (e.g., fast injection at low voltage) of hot holes in the nFET 102 into the common gate 114, thus turning on the nFET 102, and efficient injection of hot electrons in the pFET 104 into the common gate 114, thus turning off the nFET 102. The detailed operation of the EEPROM cell 100, including writing, erasing, and reading is described in greater detail below.

It is to be understood that aspects of the present invention will be described in terms of a given illustrative architecture; however, other architectures, structures, substrate materials and process features and steps may be varied within the scope of aspects of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 3:
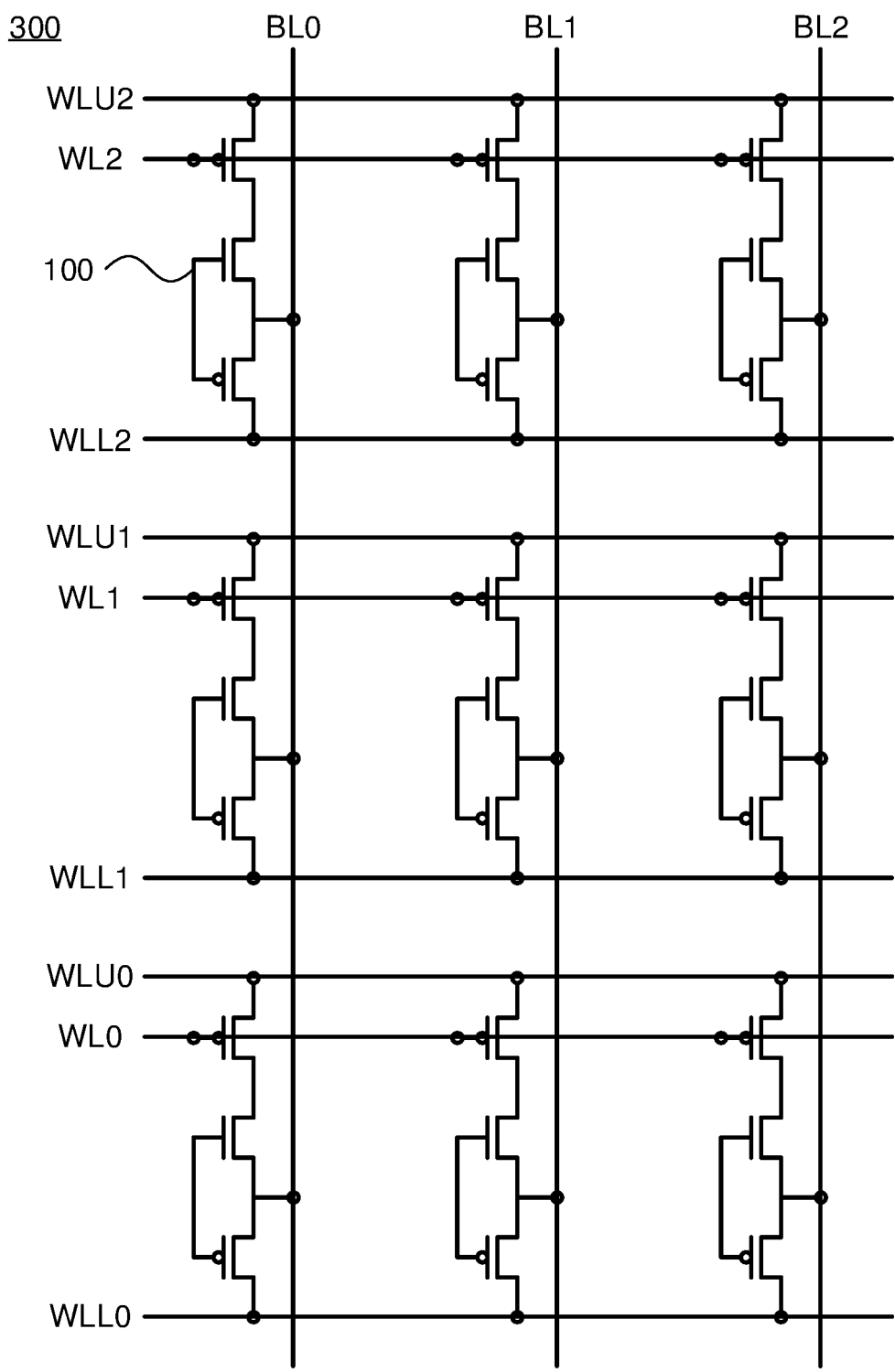
FIG. 3 is a circuit schematic of an array of memory cells in accordance with the present principles.

Referring now to FIG. 3, an array 300 of EEPROM devices 100 is shown. This array 300 has a 3×3 grid of EEPROM devices 100, each with its high voltage terminal 110 connected to an upper wordline WLU, its low voltage terminal 112 connected to a lower wordline WLL, the gate terminal of its access transistor 106 connected to a wordline WL, and its output terminal 108 connected to a bitline BL. It should be understood that an array of any size may be used instead. The array 300 may be built on, e.g., bulk semiconductor, semiconductor-on-insulator, or thin films of polycrystalline silicon on insulator.

The logic circuits that control the operation of a memory array can be fabricated on the same semiconductor substrate as the memory array to produce a memory chip, or they can be fabricated on a separate substrate and then packaged together with the memory array to form a memory package. These logic circuits are referred to herein as peripheral circuits. The peripheral circuits may be integrated with the memory array(s) on the same semiconductor substrate to improve speed and reliability. Alternatively, to reduce cost, which is important for large EEPROM systems, the peripheral circuits can be built on bulk semiconductor or semiconductor-on-insulator substrates independent of the array.

The common floating gate 114 of each EEPROM device 100 is programmed by avalanche hot-hole injection in the nFET 102 (writing a logical '1' to the device 100) and hot-electron injection in the pFET 104 (writing a logical '0'). Furthermore, the gate dielectric of the nFET 102 is chosen to enable fast injection of hot holes at low voltage, and the gate dielectric of the pFET 104 is chosen to enable fast injection of hot electrons at low voltage. As an example, for a pFET having $HfO_2$ as gate dielectric, hot-electron injection can be accomplished in less than 10 ns at a source-to-drain voltage of about 3V. For an EEPROM cell 100 operated with about 3V across its nFET 102 for avalanche hot-hole injection and about 3V across its pFET 104 for avalanche hot-electron injection, the applied voltages for array 300 during operation can be as follows. When no action is being performed, during standby, the voltage on WL=WLU=WLL=BL=~1.5V. The voltages for selecting a EEPROM device 100 for reading, writing a value '1' or writing a value '0' are as indicated in Table 1.

To write a value '1' to the EEPROM device 100, the high voltage terminal line WLU is raised to about 3.0V and the access wordline WL and the output line BL are dropped to about 0V, turning on access transistor 106 and creating a voltage of about 3V across the floating-gate nFET 102, causing hot-hole injection in the nFET 102. To write a value '0' to the EEPROM device 100, both the wordline WL and the high-voltage line WLU are kept at their standby value of about 1.5 V, thus keeping access transistor 106 off, the low-voltage line WLL is dropped to about 0V and the output line BL is raised to about 3.0V to create a voltage of about 3V across the pFET 104, causing hot-electron injection in the pFET 104. To read the value of the device, the voltage of WL, WLL, and BL drops to about 0V, creating a voltage of about 1.5V across the nFET 102 and a voltage of about 0V across the pFET 104, thus enabling the memory state of nFET 102 to be read at the BL. Table 1 shows the different values for WL, WLL, WLU, and BL for a cell (0,0) in the array. The voltage could vary by about 10% in this specific embodiment without affecting proper operation of the array. In general, the time needed for hot-carrier injection in nFET 102 and pFET 104 is a strong function of the voltage across the devices during injection. For example, for a pFET having $SiO_2$ as gate dielectric, the rate of hot electron injection may increase by about 10× when the device voltage is changed from about 3V to about 3.5V. A 10% voltage variation is well within the design of typical integrated circuit chips.

TABLE 1

|  | WL0 | WLU0 | WLL0 | BL0 |
| --- | --- | --- | --- | --- |
| Write '1' | 0 V | 3.0 V | 1.5 V | 0 V |
| Write '0' | 1.5 V | 1.5 V | 0 V | 3.0 V |
| Read | 0 V | 1.5 V | 0 V | 0 V |

For non-selected cells on the same wordline, for example when writing a '1' to another cell, the voltage across the nFET 102 will be about 1.5V and there will be negligible hot-hole injection in the nFET 102. Similarly, when writing a '0' in another cell, the voltage across the non-selected pFETs 104 will be about 1.5V, resulting in negligible hot-electron injection in the pFETs 104. For non-selected cells on the same output bitline a similar effect is achieved. When writing a '1', non-selected cells on the same bitline will have a voltage of about 1.5V across the pFETs 104 and, when writing a '0', non-selected cells will have a voltage of about 1.5 V across the nFETs 102.

The use of low injection-barrier materials in the EEPROM devices 100 provide superior efficiency, as significantly lower voltages may be used as compared to when conventional materials are used. For example, with a silicon dioxide gate dielectric layer, there is negligible hot-electron injection at voltages less than about 2.5V whereas, with a low injection-barrier material such as $HfO_2$, appreciable hot-electron injection can be achieved at voltages starting at about 1.5V. For programming with electron injection densities of about $1 \cdot 10^{12}$/cm, a semiconductor-on-insulator pFET with an $HfO_2$ gate dielectric can be programmed in less than 10 ns at a voltage of 2.5V.

Figure 4:
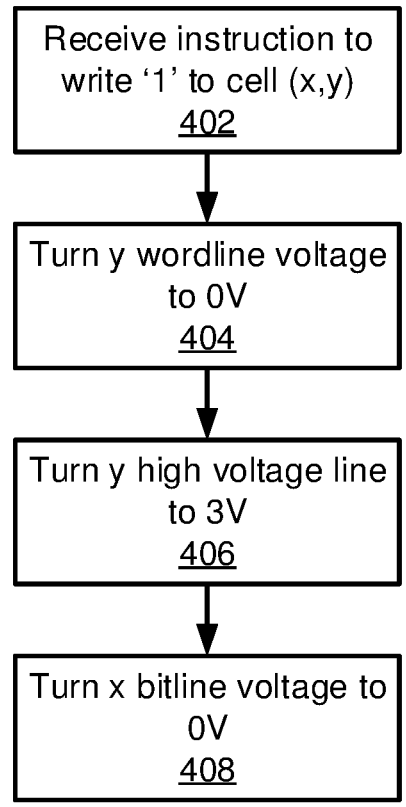
FIG. 4 is a block/flow diagram of a method of writing information to a memory cell in accordance with the present principles.

Referring now to FIG. 4, a method of writing a logical '1' to an EEPROM device 100 is shown. Block 402 receives an instruction to write a logical '1' to the device 100 at cell (x,y) of an array (with x representing the horizontal index and y representing the vertical index). Block 404 turns the voltage of WLy to zero. Block 406 turns the voltage of WLUy to, e.g., 3V. Block 408 turns the voltage of BLx to 0V. The voltage of WLLy remains about 1.5V. This creates a voltage of about 3.0V across the nFET 102 of the device 100 at cell (x,y), causing hot hole injection to the common floating gate 114.

Figure 5:
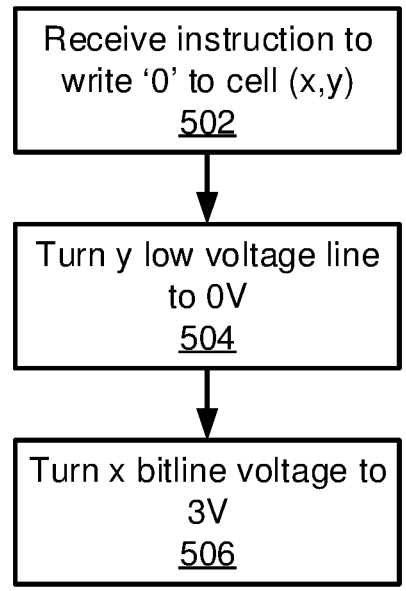
FIG. 5 is a block/flow diagram of a method of writing information to a memory cell in accordance with the present principles.

Referring now to FIG. 5, a method of writing a logical '0' to an EEPROM device 100 is shown. Block 502 receives an instruction to write a logical '0' to the device 100 at cell (x,y) of an array. Block 504 turns the voltage of WLLy to 0V. Block 406 turns the voltage of BLx to 3V. The voltages of WLUy and WLy remain about 1.5V. This creates a voltage of about 3.0V across the pFET 104 of the device 100 at cell (x,y), causing hot electron injection to the common floating gate 114.

Figure 6:
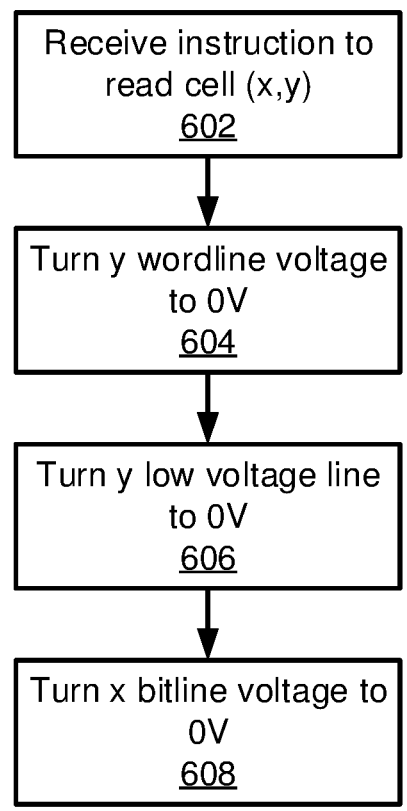
FIG. 6 is a block/flow diagram of a method of reading information from a memory cell in accordance with the present principles.

Referring now to FIG. 6, a method of reading a value stored in an EEPROM device 100 is shown. Block 602 receives an instruction to read the logical value of the device 100 at cell (x,y) of an array. Block 604 turns the voltage of WLy to 0V. Block 606 turns the voltage of WLLy to 0V. Block 608 turns the voltage of BLx to 0V. This results in about 1.5V across the nFET 102 and about 0V across the pFET 104. Depending on the charge of the common floating gate 114, the nFET 102 will be either turned on (i.e., conducting) or turned off (i.e., non-conducting). If the nFET 102 is conducting, a current will flow from the high-voltage terminal 110 through the nFET 102 to the common output terminal 108 on the bitline. If the nFET 102 is non-conducting, there is negligible current flow to the common output terminal 108 on the bitline.

Having described preferred embodiments of memory arrays using common floating gate series devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A memory array, comprising:
   an N×M array of memory cells, each memory cell comprising:
   an n-type transistor connected to a first terminal, comprising a low injection-barrier material gate dielectric;
   a p-type transistor connected in serial between the n-type transistor and a second terminal, comprising a low injection-barrier material gate dielectric, wherein the first and second transistor share a common floating gate and a common output node; and
   an access transistor connected in serial between the first terminal and a high voltage terminal, the access transistor being configured to trigger hot-carrier injection to the common floating gate to change a voltage of the common floating gate; and
   N bitline terminals connected to the output nodes of respective columns of memory cells;
   M upper wordline terminals connected to the high voltage terminals of respective rows of memory cells;
   M access wordline terminals connected to access transistor gates of respective rows of memory cells; and
   M lower wordline terminals connected to the second terminals of respective memory cells.

2. The memory array of claim 1, wherein each access transistor is a p-type transistor.

3. The memory array of claim 1, wherein hot-carrier injection is triggered when a voltage across one of a n-type transistor and a p-type transistor in a memory cell is about 3.0V.

4. The memory array of claim 1, wherein a voltage of the common floating gate determines a logical state of the respective memory cell.

5. The memory array of claim 1, wherein the low injection-barrier material of the n-type transistor is selected from a group consisting of silicon nitride (Si3N4), yttrium oxide (Y2O3), zirconium dioxide (ZrO2), and hafnium dioxide (HfO2).

6. The memory array of claim 1, wherein the low injection-barrier material of the p-type transistor is selected from a group consisting of silicon nitride (Si3N4), yttrium oxide (Y2O3), zirconium dioxide (ZrO2), and hafnium dioxide (HfO2).

7. The memory array of claim 1, wherein the first terminal of each memory cell is kept at a higher voltage than the second terminal.

8. A method of storing information on a memory cell in a memory array formed from an N×M array of memory cells, comprising:
   triggering hot carrier injection in a memory cell in the N×M array of memory cells, each memory cell comprising an n-type transistor, a p-type transistor, and an access transistor, the n-type transistor and the p-type transistor each sharing a common floating gate and a common output node and each comprising a low injection-barrier material gate dielectric, said triggering comprising:
   setting a voltage in each of N bitline terminals connected to output nodes of respective columns of memory cells;
   setting a voltage in M upper wordline terminals connected to high voltage terminals of respective rows of memory cells;
   setting a voltage in M access wordline terminals connected to access transistor gates of respective rows of memory cells; and
   setting a voltage in M lower wordline terminals connected to second terminals of respective memory cells.

9. The method of claim 8, wherein the n-type transistor and the p-type transistor are connected in serial between a first terminal having a first voltage and a second terminal having a second voltage lower than the first voltage.

10. The method of claim 8, wherein triggering hot carrier injection comprises injecting hot electrons in the p-type transistor to change a charge on the shared floating gate and to write a logical '0' to the memory cell.

11. The method of claim 8, wherein triggering hot carrier injection comprises injecting hot holes in the n-type transistor to change a charge on the shared floating gate and to write a logical '1' to the memory cell.

\* \* \* \* \*